(12) United States Patent
Leussler et al.

(10) Patent No.: US 12,092,712 B2
(45) Date of Patent: Sep. 17, 2024

(54) MAGNETIC RESONANCE COIL ARRAY AND SELF-COMPENSATED RADIOFREQUENCY CHOKE

(71) Applicant: KONINKLIJKE PHILIPS N.V., Eindhoven (NL)

(72) Inventors: Christoph Günther Leussler, Hamburg (DE); Oliver Lips, Hamburg (DE); Peter Venickel, Hamburg (DE); Peter Caesar Mazurkewitz, Hamburg (DE); Christian Findeklee, Norderstedt (DE); Ingo Schmale, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 77 days.

(21) Appl. No.: 18/009,366

(22) PCT Filed: Jun. 18, 2021

(86) PCT No.: PCT/EP2021/066582
§ 371 (c)(1),
(2) Date: Dec. 9, 2022

(87) PCT Pub. No.: WO2022/002635
PCT Pub. Date: Jan. 6, 2022

(65) Prior Publication Data
US 2023/0258749 A1 Aug. 17, 2023

(30) Foreign Application Priority Data

Jun. 30, 2020 (EP) ..................................... 20183168

(51) Int. Cl.
*G01R 33/36* (2006.01)
(52) U.S. Cl.
CPC ................................ *G01R 33/3685* (2013.01)

(58) Field of Classification Search
CPC ............................. G01R 33/36; G01R 33/3685
See application file for complete search history.

(56) References Cited

U.S. PATENT DOCUMENTS

| 4,922,204 A | 5/1990 | Duerr et al. |
| 5,450,011 A | 9/1995 | Boeijen et al. |
| (Continued) | | |

FOREIGN PATENT DOCUMENTS

| JP | 0729815 U | 6/1995 |
| JP | 07162257 A | 6/1995 |
| (Continued) | | |

OTHER PUBLICATIONS

International Search Report and Written Opinion from PCT/EP2021/066582 mailed Sep. 22, 2021.

*Primary Examiner* — Gregory H Curran

(57) ABSTRACT

The invention relates to a magnetic resonance coil array (30) of a magnetic resonance system having a distributed cable routing realized by a self-compensated radiofrequency choke (10). The magnetic resonance coil array (30) comprises multiple magnetic resonance receive coils (32), an input-output unit (34), and multiple coaxial cables (14) interconnecting the magnetic resonance receive coils (32) with the input-output unit (34). The coaxial cable (14) comprises the self-compensated radiofrequency choke (10). The self-compensated radiofrequency choke (10) allows to replace conventional bulky resonant radiofrequency traps used in conventional magnetic resonance coil arrays and allows implementing the distributed cable routing. The self-compensated radiofrequency choke (10) comprises a choke housing (12) having a toroidal form and the coaxial cable (14), wherein the coaxial cable (14) is wound around the choke housing (12) in a self-compensated winding pattern. The self-compensated winding pattern provides compensation for a B1-excitation field of a magnetic reso- (Continued)

nance system and eliminates the need for the self-compensated radiofrequency choke (10) to be resonant to the B1-excitation field.

12 Claims, 3 Drawing Sheets

(56) References Cited

U.S. PATENT DOCUMENTS

| | | | |
|---|---|---|---|
| 6,414,485 B1 | 7/2002 | Kato et al. | |
| 8,547,102 B2* | 10/2013 | Nozaki | G01R 33/3685 |
| | | | 324/318 |
| 10,192,676 B2 | 1/2019 | Ohdaira | |
| 10,895,615 B2* | 1/2021 | Wynn | G01R 33/3685 |
| 2006/0006963 A1 | 1/2006 | Ji | |
| 2006/0164089 A1 | 7/2006 | Gross | |
| 2008/0204021 A1 | 8/2008 | Leussler et al. | |
| 2010/0063383 A1 | 3/2010 | Anderson et al. | |
| 2010/0253454 A1* | 10/2010 | Schilling | H01F 27/363 |
| | | | 336/20 |
| 2012/0074944 A1 | 4/2012 | Leussler | |
| 2012/0079944 A1 | 4/2012 | Vob | |
| 2014/0002084 A1 | 1/2014 | Han et al. | |
| 2015/0173678 A1 | 6/2015 | Jones | |
| 2016/0064139 A1 | 3/2016 | Chuang | |
| 2018/0275227 A1 | 9/2018 | Song et al. | |
| 2018/0348316 A1 | 12/2018 | Du et al. | |
| 2019/0277926 A1 | 9/2019 | Stormont et al. | |

FOREIGN PATENT DOCUMENTS

| | | |
|---|---|---|
| WO | 2015150507 A1 | 10/2015 |
| WO | 2018077679 A1 | 5/2018 |
| WO | 2019067905 A1 | 4/2019 |

* cited by examiner excitation field and, wherein the self-compensated winding pattern comprises a first winding pattern (20) with windings around a surface of revolution of the toroidal form, and a counter winding pattern (22) with at least one winding around an axis of revolution (24) and along an outer circumference of the toroidal form.

MAGNETIC RESONANCE COIL ARRAY AND SELF-COMPENSATED RADIOFREQUENCY CHOKE

CROSS REFERENCE TO RELATED APPLICATIONS

This application is a U.S. national phase application of International Application No. PCT/EP2021/066582 filed Jun. 18, 2021, which claims the benefit of EP Application Serial No. 20183168.2 filed on Jun. 30, 2020 and is incorporated herein by reference.

FIELD OF THE INVENTION

The invention relates to the field of magnetic resonance (MR), and in particular to a magnetic resonance coil array having distributed cable routing realized by a self-compensated radiofrequency choke.

BACKGROUND OF THE INVENTION

For magnetic resonance (MR) systems and especially for magnetic resonance imaging (MRI) systems, efforts are continuously being made to increase the number of radiofrequency (RF) receive coils that are used in order to increase the speed of image acquisition. It is not uncommon to have up to sixty-four RF receive coils in a magnetic resonance coil array. The RF receive coils are typically connected by a coaxial cable to an RF receiver that samples and digitizes the received RF signal. Due to these increases in RF channel count, MRI system designers are under continuous pressure to reduce the sizes of components and sub-assemblies that are employed with the RF receive coils.

WO 2018/077679 A1 provides a balun that is suitable for use with miniature coaxial cables and that obviates the need to cut the cable in order to install the balun. A portion of each coaxial cable that extends from the RF receive coils to an RF receiver is wound multiple times around a device to form an inductor.

The US patent application US2012/0079944 concerns a cabling arrangement for a multi-resonant MRI system. A suitable resonant circuit embodiment disclosed which includes a toroid coil conductor defining the impedance of the electrical cable to which it is coupled.

SUMMARY OF THE INVENTION

Magnetic resonance imaging (MRI) is an imaging technology that is based on the principles of nuclear magnetic resonance, i.e. that atomic nuclei with non-zero spin have a magnetic moment. In medical MRI, the atomic nuclei with non-zero spin is usually the nuclei of hydrogen atoms, which are present in the human or animal body. Radio frequency (RF) waves forming a $B_1$-excitation field, are directed at the nuclei in an external magnetic field, leading to an excitation of the protons and a subsequent relaxing process of the protons. Relaxation of the protons, results in RF signals being emitted by the nuclei that can be detected and processed to form an image.

A typical MRI system generally comprises a magnet, for example a superconducting electromagnet, that produces a strong static magnetic field, gradient coils that produce linear variations in the static magnetic field, RF transmit coils that produce the $B_1$-excitation field, and RF receive coils that detect the magnetic resonance RF signal emitted by the relaxing nuclei. Generally coaxial cables are used in MRI systems for the controlled transmission of RF signals within the coils. A coaxial cable has an outer shield and an inner conductor that are separated from one another by a dielectric material. The outer shield has the aim to protect the inner conductor from picking up undesired frequencies.

However, sources external to the coaxial cable can induce unintended electrical currents in the outer shield and thus generate unintended magnetic fields that influence the signal to noise ratio of the RF receive coil array adversely. For this reasons RF traps, such as Baluns or RF chokes, are used with coaxial cables in MRI systems.

Typically, multiple RF receive coils are used in MRI systems forming a receive coil array. Traditional RF receive coils and RF receive coil arrays tend to be bulky and/or rigid and are configured to be maintained at a fixed position relative to other RF receive coils in the coil array and relative to the imaging subject, respectively. The bulkiness and lack of flexibility often prevents the RF receive coils from coupling most efficiently with the desired anatomy of the imaging subject and tends to make the imaging process uncomfortable to the imaging subject.

By increasing the number of RF receive coils in the coil array the time for image acquisition can be reduced. However, the increasing number of RF receive coils calls for the need to miniaturize the components that are employed with the RF receive coils i.e. RF cables, RF traps such as RF chokes, preamplifiers, and printed circuit boards (PCB). Along with the goal to miniaturize RF receive coil arrays, the RF receive coils and the electronics come closer to the imaging subject, compared with traditional RF receive coils, rendering the form, size and weight of the receive coils and coil electronics even more important for the experience of the imaging subject and the handling experience of the operator. However, due to the rugged environment for MRI systems in hospitals the RF receive coils and components still need to be designed robustly so that the systems survive daily clinical routine.

Therefore, it is an object of the invention to provide a robust and flexible RF receive coil array that enhances imaging subject and operator experience. A further object of the invention is to provide a RF choke that allows realizing the robust and thin flexible RF receive coil array.

According to the invention, this object is addressed by the subject matter of the independent claims. Preferred embodiments of the invention are described in the sub claims.

Therefore, according to the invention, a radiofrequency choke for a magnetic resonance system comprising a choke housing having a toroidal form and a coaxial cable is provided, wherein the coaxial cable has a first end and a second end and is configured to carry a magnetic resonance radiofrequency signal of the magnetic resonance system having a $B_1$-excitation field, wherein a portion of the coaxial cable in between the first end and the second end is wounded around the choke housing in a self-compensated winding pattern such that the radiofrequency choke compensates the $B_1$-excitation field and, wherein the self-compensated winding pattern comprises a first winding pattern (20) with windings around a surface of revolution of the toroidal form, and a counter winding pattern (22) with at least one winding around an axis of revolution (24) and along an outer circumference of the toroidal form.

Furthermore, according to the invention, a magnetic resonance coil array for a magnetic resonance system having a $B_1$-excitation field is provided comprising multiple magnetic resonance receive coils, wherein the magnetic resonance receive coil is configured to output a magnetic resonance radiofrequency signal, an input-output unit, wherein the input-output unit is configured to receive the magnetic resonance radiofrequency signal, and multiple coaxial cables interconnecting the magnetic resonance receive coils with the input-output unit, wherein the coaxial cable is configured to carry the magnetic resonance radiofrequency signal and comprises the above radiofrequency choke.

The basic idea of the invention is to use an RF choke having a self-compensated winding pattern, also called a self-compensated RF choke. The self-compensated winding pattern provides compensation for the $B_1$-excitation field of the MRI system and eliminates coupling to local nearby coils. Preferably, the self-compensated winding pattern is responsible for the behavior of the self-compensated RF choke as an ideal inductor. Due to the stray capacitance of the self-compensated winding pattern, the self-compensated RF choke is self-resonant at a self-resonant frequency. Generally, the self-resonant frequency of an inductor is the frequency at which the stray capacitance of the inductor resonates with the ideal inductance of the inductor, resulting in a very high impedance. Thus, the self-resonance of the self-compensated RF choke helps to increase the impedance of the self-compensated RF choke. The self-resonant frequency of the self-compensated RF choke preferably depends on the specific geometry of the choke housing, the self-compensated winding pattern and a diameter of the coaxial cable. Even if the self-resonant frequency is not at the same frequency or close to the frequency of the $B_1$-excitation field of the MRI system, the self-compensated RF choke still provides a high impedance. Thus, signal to noise ratio of the MRI system is improved without the need to design the RF choke to have a resonant frequency that is equal or close to the $B_1$-excitation field as necessary for conventional resonant RF traps. Furthermore, conventional resonant RF traps need an additional capacitor to realize resonant trap with high impedance, as the self-inductivity is low.

With regard to the magnetic resonance receive coil array, the self-compensated RF choke allows to replace conventional bulky resonant RF traps used in conventional receive coil arrays and hence allows implementing a distributed cable routing, wherein preferably each magnetic resonance receive coil is connected to the input-output unit by the coaxial cable comprising the self-compensated RF choke. In contrast to conventional cable routings, where the coaxial cables are routed along a fishbone structure and where the parallel routing of the coaxial cables lead to thick and inflexible cable bundles and large RF traps, the distributed cable routing of the invention is flexible. In other words, the coaxial cables interconnecting each magnetic resonance receive coil with the input-output unit have no rigid predefined structure, but preferably the cable routing is flexible and thus adaptable to specific situations.

The self-compensated RF choke comprises a choke housing having a toroidal form. In mathematics a toroid is a three-dimensional object generated by revolving a two-dimensional object, e.g. a circle, rectangle or square, in three-dimensional space about an axis of revolution that is coplanar with the two-dimensional object, wherein the axis of revolution does not touch the two-dimensional object. In other words, a toroid is a three-dimensional object that resembles a doughnut and has a circular hole in the middle. The axis of revolution passes through the middle of the circular hole. The choke housing of the self-compensated RF choke has a toroidal form, meaning that the shape of the choke housing is essentially a toroid. However, small deviations from the above mathematical definition may be allowed, e.g. the choke housing may comprise additional features such as holes or grooves, such that the choke housing itself may not be rotational symmetric. It may also be the case that the choke housing has the form of a toroidal polyhedron, that approximates the form of a torus by several polygonal faces.

Preferably, the two-dimensional object forming the toroidal form of the choke housing is a rectangle, more preferably a rectangle having rounded corners. Even more preferably, a longer side of the rectangle is parallel to the axis of revolution of the toroidal form.

The self-compensated RF-choke further comprises a coaxial cable having a first and second end. Preferably, the coaxial cable has an outer shield and an inner conductor that are separated from one another by a dielectric material. Typically, coaxial cables are used in MRI systems for the controlled transmission of RF signals, since the outer shield has the aim to protect the inner conductor from picking up undesired frequencies. The coaxial cable has two ends, the first end and the second end. Preferably, the coaxial cable is configured to carry the magnetic resonance RF signal of the magnetic resonance system from the first end of the coaxial cable to the second end of the coaxial cable. A portion of the coaxial cable in between the first end and second end is wound around the choke housing in a self-compensated winding pattern. Being wound around the choke housing preferably means that the coaxial cable is wound along the toroidal form of the choke housing. The winding of the coaxial cable in the self-compensated winding pattern preferably accounts for the characteristics of the self-compensated RF choke, i.e. that the self-compensated RF choke compensates the $B_1$-excitation field without the need to be resonant to the $B_1$-excitation field.

The self-compensated RF choke is suitable for use in magnetic resonance systems, especially in magnetic resonance imaging systems. The self-compensated RF choke may be preferably used in magnetic resonance coil arrays. Further preferred applications of the self-compensated RF choke are in active or passive sensors in magnetic resonance imaging systems, including but not limited to radiation sensors, ultrasound sensors, optical sensors, and/or RADAR sensors.

With regard to the self-compensated winding pattern of the self-compensated RF choke and according to a preferred embodiment of the invention, the self-compensated winding pattern comprises a first winding pattern with windings around a surface of revolution of the toroidal form, and a counter winding pattern with at least one winding around an axis of revolution and along an outer circumference of the toroidal form. The first winding pattern comprises windings around the surface of revolution of the toroidal form. In other words, this means that the coaxial cable is wound along the surface of revolution such that the windings of the first winding pattern essentially correspond in their shape to the shape of the two-dimensional object used for generating the toroidal form. Preferably, the first winding pattern is generated by guiding the coaxial cable through the circular hole of the toroidal form along the axis of revolution in a first direction, then by guiding the coaxial cable outwards and away from the axis of revolution and towards the outer circumference of the toroidal form, then by guiding the coaxial cable parallel to the axis of revolution but in a direction contrary to the first direction, and then by guiding the coaxial cable towards the axis of revolution for starting the guiding procedure all over. In this way a helix along the surface of revolution is formed constituting the first winding pattern. Preferably, a spacing between the individual turns of the first winding pattern is constant and further preferably the first winding pattern is evenly distributed along the choke housing. This helps maintaining a constant characteristic impedance throughout the choking function of the self-compensated RF choke.

The self-compensated winding pattern further comprises a counter winding patter with at least one winding around the axis of revolution and along the outer circumference of the toroidal form. In other words, the counter winding pattern has the form of a circle. Preferably, the counter winding pattern is arranged within the first winding pattern, in other words the helix of the first winding pattern is preferably formed around the counter winding pattern. Preferably, the counter winding pattern provides the $B_1$-excitation field compensation. More preferably, the self-compensated RF choke provides an isolation of >20 dB for the shield of the coaxial cable.

According to a preferred embodiment of the invention and in order to facilitate a constant spacing in the first winding pattern and to achieve a well-defined counter winding pattern, the choke housing comprises a first cut out structure and a second cut out structure, wherein the first cut out structure comprises multiple cut outs for guiding the first winding pattern of the self-compensated winding pattern, wherein each cut out is located in a plane comprising the axis of revolution of the toroidal form, wherein the second cut out structure comprises a further cut out for guiding the counter winding pattern of the self-compensated winding pattern, wherein the further cut out is located in a plane perpendicular to the axis of revolution of the toroidal form and along the outer circumference of the toroidal form. In other words, the choke housing has no plain surface but comprises cut outs in the form of grooves that guide the coaxial cable.

For guiding the coaxial cable to form the first winding pattern, the choke housing comprises the first cut out structure having multiple cut outs. Each of the cut outs of the first cut out structure is located in the plane comprising the axis of revolution. Each cut out of the first cut out structure may correspond in its course on the surface of the choke housing to a part of the outer shape of the two-dimensional object used for generating the toroidal form. For example, if the toroidal form is generated by revolving a rectangle around the axis of revolution with the longer side of the rectangle parallel to the axis of revolution, the course of the cut out may correspond to a part the sides of the rectangle. For example, the cut out's course on the surface may correspond to the two longer sides of the rectangle, to the two shorter sides of the rectangle, or to a part of the longer and the shorter side of the rectangle connected at a corner of the rectangle. Preferably the multiple cut outs of the first cut out structure are evenly spaced apart from one another and further preferably are distributed evenly across the choke housing.

For guiding the coaxial cable to form the counter winding pattern, the choke housing comprises the second cut out structure having the further cut. The further cut out is located in the plane perpendicular to the axis of revolution and along the outer circumference of the toroidal form. In other words, the further cut out has the form of a circle. In case the toroidal form is generated by revolving a rectangle around the axis of revolution with one side of the rectangle parallel to the axis of revolution, the further cut out is preferably located at half height of the side of the rectangle.

According to another preferred embodiment of the invention, the choke housing comprises an open cut and/or a circular hollow opening. As already mentioned, for forming the first winding pattern the coaxial cable needs to be guided through the circular hole of the toroidal form, followed by several changes of directions before repeating the process, thus making the winding of the coaxial cable rather tedious. Providing an open in the choke housing simplifies the winding process, since for forming the first winding pattern the changes of directions can be omitted. The open cut is preferable located within the plane comprising the axis of revolution. Thus, the open cut in the choke housing makes it possible to use a winding machine that automatically wounds the coaxial cable around the choke housing. Alternatively or additionally to the open cut, the choke housing may comprise a circular hollow opening. This is particularly favorable when the self-compensated RF choke is produced by a 3D printing and/or additive manufacturing process.

According to a preferred embodiment of the invention, the coaxial cable is a micro coaxial cable and/or the toroidal form has a diameter of 12 mm+/−25% and a thickness of 5 mm+/−25%. The micro coaxial cable has preferably a diameter less than one millimeter. Micro coaxial cables have the advantage that the self-compensated RF choke can be made small and lightweight. Furthermore, parasitic capacitance due to proximity of the coaxial cable to other electronic components is less pronounce in micro coaxial cables than in conventional coaxial cables. Using a micro coaxial cable also allows that the choke housing has small dimensions: Preferably the outer diameter of the toroidal form is 12 mm+/−25% and the inner diameter is 5+/−25%. With regard to the thickness, i.e. the dimension of the toroidal form parallel to the axis of revolution, the thickness is preferably 5 mm+/−25%. A self-compensated RF choke having these small dimensions is also called a self-compensated micro RF choke.

As already mentioned, a further aspect of the invention is the magnetic resonance coil array comprising multiple magnetic resonance receive coils, wherein the magnetic resonance receive coil is configured to output the magnetic resonance RF signal, the input-output unit, wherein the input-output unit is configured to receive the magnetic resonance RF signal, and multiple coaxial cables interconnecting the magnetic resonance receive coils with the input-output unit, wherein the coaxial cable is configured to carry the magnetic resonance RF signal and comprises the self-compensated RF choke. Preferably, the multiple magnetic resonance receive coils, also called RF receive coils, are arranged in a two-dimensional array. As RF receive coils planar coils and/or thin flexible head coils may be used. Furthermore, preferably each RF receive coil is connected by the coaxial cable to the input-output unit in a direct manner. Being connected in a direct manner means that the coaxial cable does not rout along a predefined structure, where several coaxial cables are combined into a cable bundle, but preferably the individual coaxial cables each route individually from the RF receive coil to the input-output unit. Preferably, the coaxial cables form no cable bundles in an area that is defined by the two-dimensional array of the RF receive coil. An advantage of the flexible routing of the coaxial cables is the option to route the coaxial cables around holes, openings and/or recess of a housing of the RF receive coils and/or of the magnetic resonance coil array. These holes, openings and/or recesses are important for the well-being of the imaging subject, since they reduce heating and provide further functionality such as the option to monitor vital signs, or to provide interventional access, such as a peripheral venous catheter for the imaging subject. The coaxial cable comprises the first end and the second end, wherein either the first or the second end is connected to the input-output unit and the other end of the coaxial cable, i.e.

either the second or the first end, is connected to the RF receive coil. The portion of the coaxial cable in between the first and second end is wounded around the choke housing in the self-compensated winding pattern in order to form the self-compensated RF choke. The self-compensated RF choke allows omitting bulky resonant RF traps in the magnetic resonance coil array and thus allows that the coaxial cable interconnecting each RF receive coil with the input-output unit has no rigid predefined structure. In this way, a flexible magnetic resonance coil array is provided that makes it possible for the RF receive coils to be positioned more arbitrarily, allowing placement and/or size of the RF receive coils to be based on desired anatomy coverage of the imaging subject. Thus, the magnetic resonance coil array may conform to the imaging subject's anatomy with relative ease. Additionally, the cost and weight of the magnetic resonance coil array may be significantly lowered due to less materials, the abandonment of conventional resonant RF traps including lumped capacitors. Furthermore, since thick cable bundles are avoided by using the self-compensated RF choke, no large and/or bulky RF traps are needed. The low weight and high flexibility of the magnetic resonance coil array further increases the imaging subject's and operator's experience.

As already mentioned, preferably each RF receive coil is connected by the coaxial cable to the input-output unit in a direct manner. However, this does not exclude that the magnetic resonance coil array may comprise additional electronic components, e.g. radiofrequency amplifiers. These additional components may also be connected to the coaxial cable. In other words, it may be possible that in between the first end and the second end of the coaxial cable further electronic parts are connected to the coaxial cable.

With regard to miniaturization and according to a preferred embodiment of the invention a magnetic resonance coil array is provided wherein the self-compensated RF choke is the self-compensated micro RF choke and the coaxial cable is the micro coaxial cable. The small dimensions of the self-compensated micro RF choke, as described above, and the micro coaxial cable enable that the magnetic resonance coil array is particularly thin, flexible and lightweight. Hence, comfort for the imaging subject and the operator are strongly increased. Furthermore, miniaturization of the components allows to implement a higher number of RF receive coils in the magnetic resonance coil array leading to a decreased acquisition time. Furthermore, compared to thick coaxial cable, micro coaxial cables have less parasitic capacitance.

In connection to a high signal to noise ratio of the magnetic resonance coil array and according to another preferred embodiment of the invention the coaxial cable and/or the self-compensated RF choke are high-impedance. In this context being high impedance means that the self-compensated RF choke provides a high suppression, preferably >20 dB, of RF currents induced by the $B_1$-excitation field in the shield of the coaxial cable. Additionally, the high impedance of the self-compensated RF choke suppresses propagation and resonance effects along the inner conductor of the coaxial cable in order to reduce coupling between individual RF receiving coils in the magnetic resonance coil array.

According to another preferred embodiment of the invention a magnetic resonance coil array is provided comprising a direct current cable configured to carry a direct current signal, wherein the direct current cable comprises a direct current choke, and wherein the direct current choke is placed inside the toroidal form of the choke housing of the self-compensated RF choke. Preferably the DC choke is placed in the circular hole of the toroidal form. The direct current cable, in short DC cable, is configured to carry the DC signal, that may be used to steer the RF receive coil of the magnetic resonance coil array. Preferably, each RF receive coil is connected to a DC cable. In order to suppress induced RF signals on the DC cable the DC cable comprises the DC choke. Preferably the DC choke is an inductor. However, placing the DC choke on the DC cable adds local weight to the DC cable making the DC cable and thus the magnetic resonance coil array more prone to mechanical stress. The mechanical stability and robustness can be increased by placing the DC choke inside the toroidal from of the choke housing of the self-compensated RF choke. Thus, the self-compensated RF choke acts as a mechanical support and protects the DC choke and DC cable, without the need to add additional mechanical support components to the magnetic resonance coil array. Furthermore, by placing the RF choke inside the toroidal form of the self-compensated RF choke decreases unwanted cross-talk between the self-compensated RF choke and the DC choke. Thus, signal to noise of the magnetic resonance coil array is increased.

In this regard and according to a preferred embodiment of the invention the shield of the coaxial cable, configured to carry the magnetic resonance RF signal may be used as wire in a DC circuit. In this case, the magnetic resonance coil array comprises one DC cable for each RF receive coil, comprising the DC choke. Thus, preferably one DC choke is placed inside the toroidal form of the choke housing of the self-compensated RF choke.

However, it may also be the case that the DC circuit is independent of the coaxial cable carrying the magnetic resonance RF signals. In this case preferably two DC cables for each RF receive coil are required. Accordingly, preferably the magnetic resonance coil array comprises two DC cables for each RF receive coil, wherein each DC cables comprise the DC choke. In this case, preferably two DC-chokes are placed inside the toroidal form of the choke housing of the self-compensated RF choke. Furthermore, coaxial cables may be used as DC cables.

According to another preferred embodiment of the invention, the magnetic resonance coil array comprises a flexible support structure, wherein the multiple magnetic resonance receive coils are arranged as two-dimensional array on and/or in the support structure, and wherein the self-compensated RF chokes and/or coaxial cables are arranged homogenously on and/or in the support structure. Being arranged homogenously preferably means that the weight of the self-compensated RF chokes and/or coaxial cables and optionally of the DC cables and/or DC chokes is uniformly distributed across the flexible support structure. Thus, the comfort for the imaging subject is enhanced. The support structure is preferably a flexible garment and/or foam. The support structure may comprise holes, pores, and/or cut outs to further increase the flexibility of the support structure and decrease the weight of the support structure. The RF receive coils and the further electrical components, i.e. the coaxial cables, the self-compensated RF choke, the DC cables and/or the DC chokes, are preferably arranged in and/or on the support structure. For example, the supports structure may comprise several layers of garment, the RF receive coils may be arranged in between two layers of garment.

Furthermore, with regard to the flexibility of the self-compensated RF choke, the choke housing is preferably made of a flexible material. While many RF chokes have an iron powder or ferrite core, the choke housing of the self-compensated RF choke is preferable non-magnetic and made of a flexible and preferably lightweight material. This further enhances the adaptability of the magnetic resonance coil array to adapt to the shape of the imaging subject.

Preferably, the magnetic resonance coil array comprising the support structure has a thickness of less than 20 mm. Furthermore, preferably the weight of the magnetic resonance coil array comprising the support structure is less than 20 g per RF receiving coil.

According to another embodiment of the invention, the multiple RF receive coils, the self-compensated RF chokes, and/or the coaxial cables are fixed to the support structure by sewing, gluing, clamps and/or an additive printing process. In order to further improve the flexibility and further decrease the low weight of the magnetic resonance coil array, the manner by which the RF receive coils and the further electrical components, i.e. the coaxial cables, the self-compensated RF choke, the DC cables and/or the DC chokes, are attached to the support structure may be lightweight and flexible as well. This requirement is met by attaching the components by gluing, sewing and/or by the additive printing process.

In this regard and according to another preferred embodiment of the invention a fixation of the self-compensated RF choke to the support structure allows rotation and/or angulation of the self-compensated RF choke with respect to the support structure. In this way, a flexible magnetic resonance coil array may be provided that allows for the self-compensated RF chokes to be positioned more arbitrarily, allowing placement to be based on the specific situation, e.g. the contours of the imaging subject. Preferably the fixation of the self-compensated RF choke allows rotation and/or angulation of the self-compensated RF choke for +/−30 degrees with respect to the support structure.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
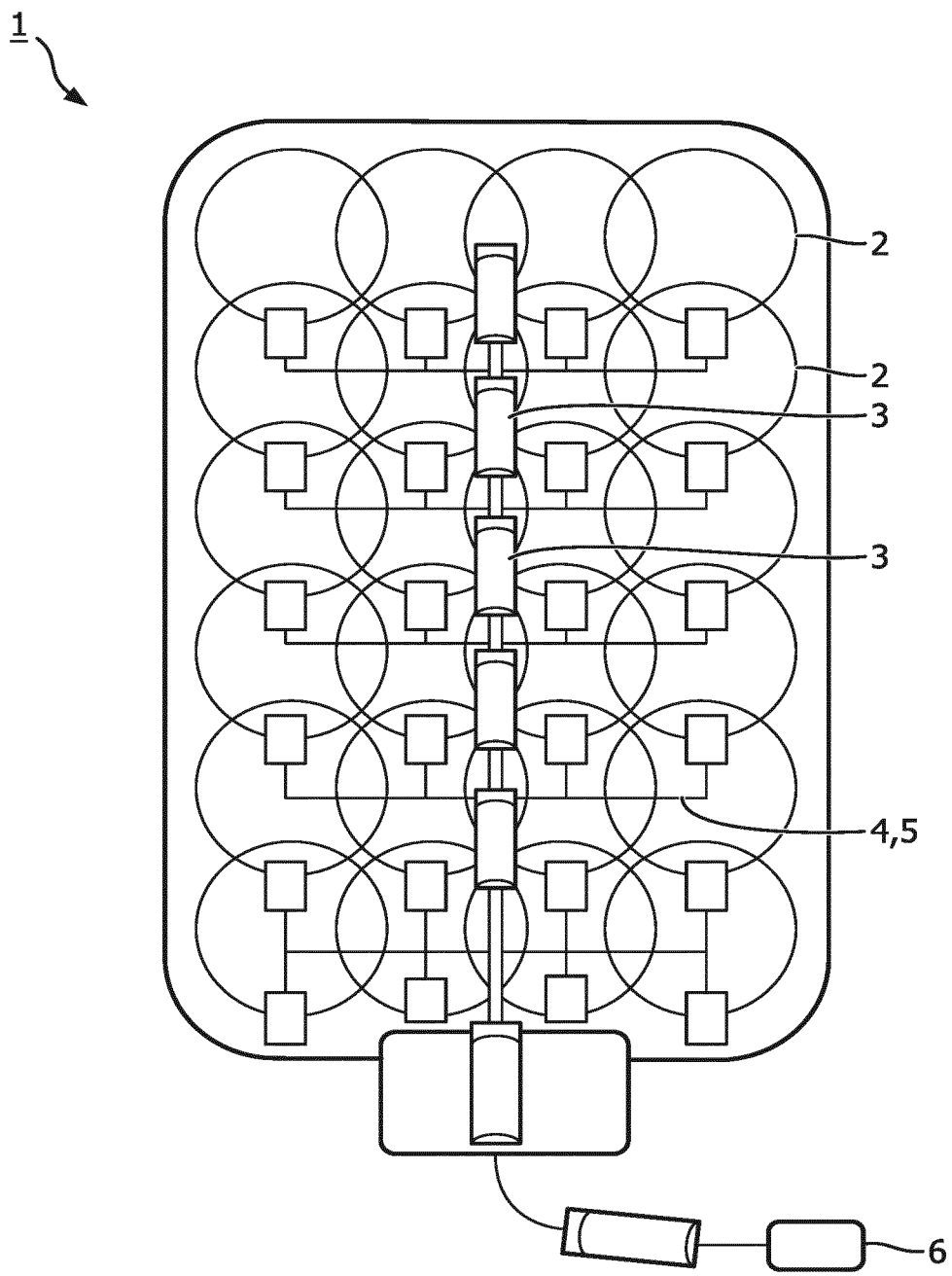
FIG. 1 schematically depicts a magnetic resonance receive coil array, wherein the cable routing has a fishbone structure as known in prior art.

FIG. 1 schematically depicts a magnetic resonance receive coil array 1 as known in prior art. The receive coil array 1 comprises several receive coils 2, that are arranged in a two-dimensional array. Each of the receive coils 2 is connected to a coaxial cable 4, that interconnects the receive coil 2 with an input-output unit 6. The individual coaxial cables 4 of the several receive coils 2 are bundled together and routed to the input-output unit 6 in a fishbone structure 5. Several bulky resonant RF traps 3 are attached to the cable bundles, leading to an inflexible magnetic resonance receive coil array 1 that has a high weight.

Figure 2:
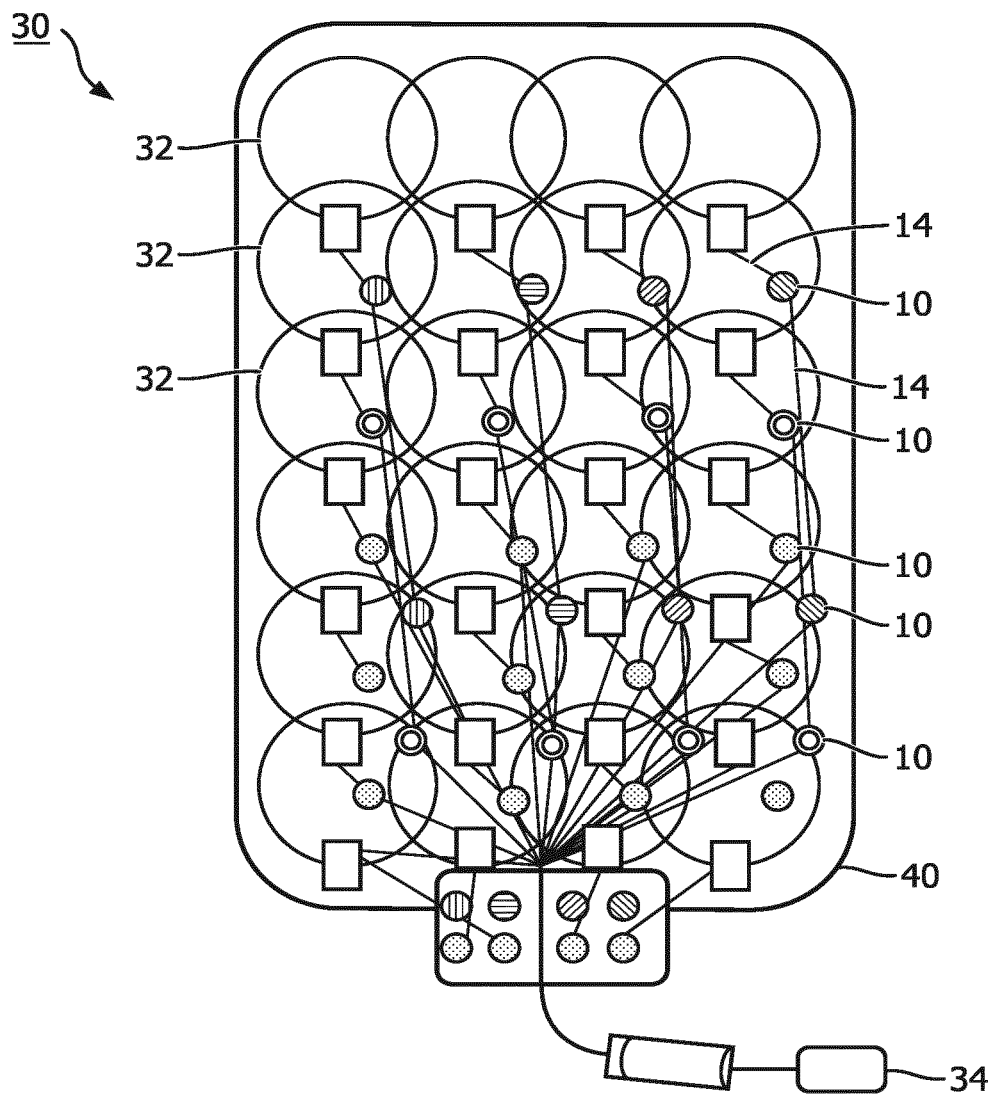
FIG. 2 schematically depicts a magnetic resonance coil array according to one possible embodiment of the invention, where multiple coaxial cables interconnect magnetic resonance receive coils with an input-output unit and wherein the coaxial cables comprise a radiofrequency choke.

FIG. 2 schematically depicts a magnetic resonance coil array 30 according to a preferred embodiment of the invention. The magnetic resonance coil array 30 comprises multiple RF receive coils 32, that are arranged as two-dimensional array. Each of the RF receive coils 32 is connected to a coaxial cable 14, that interconnects the RF receive coil 32 with an input-output unit 34. The individual coaxial cables 14 connect the RF receive coil 32 with the input-output unit 34 in a direct manner, meaning that the coaxial cables 14 are not bundled together to form cable bundles in an area defined by the two-dimensional array of the multiple RF receive coils 32. Furthermore, the coaxial cable 14 comprise a self-compensated RF choke 10. The coaxial cables 14 and the self-compensated RF choke 10 are arranged homogeneously over the area defined by the two-dimensional array, i.e. the weight of the coaxial cables 14 and self-compensated RF chokes 10 is distributed essentially evenly over the area defined by the two-dimensional array.

In this embodiment the magnetic resonance coil array 30 further comprises a support structure 40, in this embodiment a flexible garment, covering not only the area defined by the two-dimensional array of the multiple RF receive coils 32, but also overlapping this area in a symmetrical manner. Outside of the area defined by the two-dimensional array but still inside the area of the support structure, the multiple coaxial cables 14 are bundled together to form a cable bundle, which leads to the input-output unit 34. In this embodiment the magnetic resonance coil array 30 is used as a receive coil array 30 of a magnetic resonance imaging system, having a $B_1$-excitation field.

Figure 3:
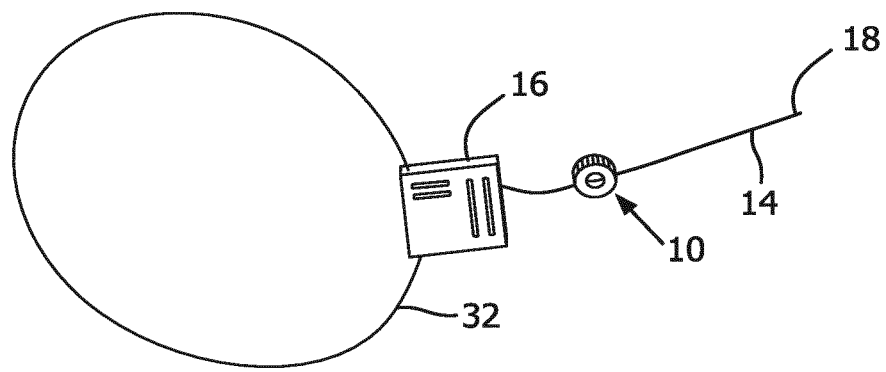
FIG. 3 schematically depicts one of the magnetic resonance receive coils and one of the coaxial cables comprising the radiofrequency choke of FIG. 2.

FIG. 3 schematically depicts one of the RF receive coils 32 and one of the coaxial cables 14 of FIG. 2 comprising the self-compensated RF choke 10. As can be seen in FIG. 3, the coaxial cable 14 comprises a first end 16, which is connected to the RF receive coil 32, and a second end 18. A portion of the coaxial cable 14 in between the first end 16 and the second end 18 is wound around a choke housing 12 (depicted in FIG. 4) having a toroidal form, in order to form the self-compensated RF choke 10. The coaxial cable 14 is wound around the choke housing 12 in a self-compensated winding pattern, such that the self-compensated RF choke 10 compensates the $B_1$-excitation field of the magnetic resonance system.

Figure 4:
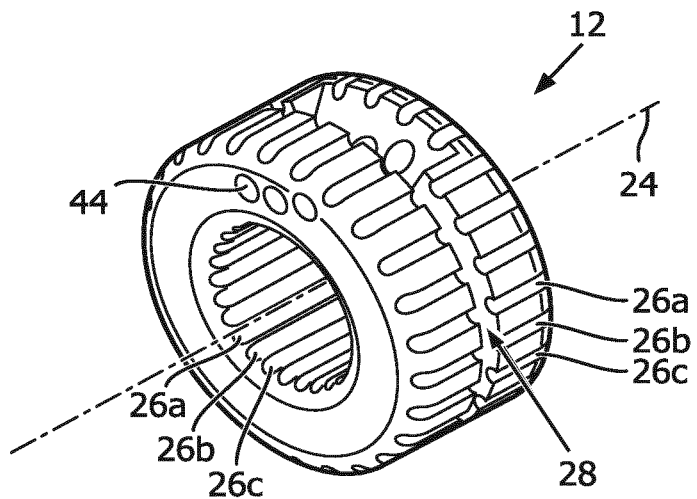
FIG. 4 schematically depicts a choke housing of the radiofrequency choke according to a possible embodiment of the invention.

FIG. 4 schematically depicts the choke housing 12 of the self-compensated RF choke 10 according to another possible embodiment of the invention. The choke housing 12 has a toroidal form, in this embodiment the toroid is formed by revolving a rectangle having rounded corners around an axis of revolution 24, wherein a longer side of the rectangle is parallel to the axis of revolution 24. As already mentioned, the coaxial cable 14 is wound around the choke housing 12 in a self-compensated winding pattern. In order to guide the winding of the coaxial cable 14 around the choke housing 12, the choke housing 12 comprises a first cut out structure 26 and a second cut out structure 28. The first cut out structure 26 comprises multiple cut outs 26a, 26b, 26c for guiding a first winding pattern 20 (depicted in FIG. 5) of the self-compensated winding pattern, wherein each cut out 26a, 26b, 26c is located in a plane comprising the axis of revolution 24 of the toroidal form. In this embodiment the cut outs 26a, 26b, 26c of the first cut out structure 26 are located on the surface of the toroidal form corresponding to the two longer sides of the rectangle. With regard to the second cut out structure 28, the second cut out structure 28 comprises a further cut out 28 for guiding a counter winding pattern 22 (depicted in FIG. 5) of the self-compensated winding pattern, wherein the further cut out 28 is located in a plane perpendicular to the axis of revolution 24 of the toroidal form and along an outer circumference of the toroidal form. As can further be seen in FIG. 4, the choke housing 12 further comprises three small holes 44, in order to guide the transition of the coaxial cable 14 from the first winding pattern 20 to the counter winding pattern 22.

Figure 5:
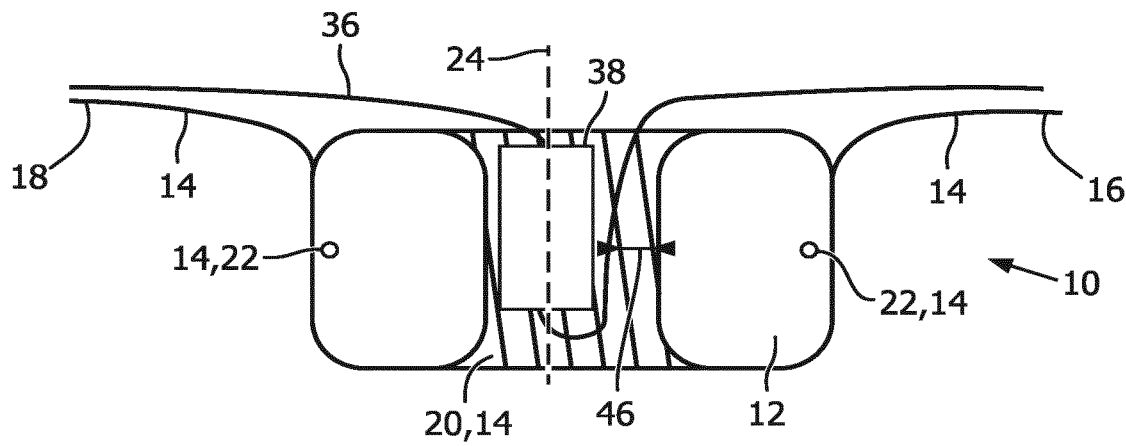
FIG. 5 schematically depicts a cross section through the radiofrequency choke of the magnetic resonance coil array according to another possible embodiment of the invention.

FIG. 5 schematically depicts a cross section through the self-compensated RF choke 10 of the magnetic resonance coil array 30, according to another possible embodiment of the invention. As can be seen in FIG. 5 the self-compensated winding pattern comprises the first winding pattern 20 with windings around the surface of revolution of the toroidal form, and the counter winding pattern 22 with one winding around the axis of revolution 24 and along the outer circumference of the toroidal form. The first winding pattern 20 is generated by guiding the coaxial cable 14 through the circular hole of the toroidal form along the axis of revolution 24 in a first direction, then by guiding the coaxial cable 14 outwards and away from the axis of revolution 24 and towards the outer circumference of the toroidal form, then by guiding the coaxial cable 14 parallel to the axis of revolution 24 but in a direction contrary to the first direction, and then by guiding the coaxial cable 14 towards the axis of revolution 24 for starting the guiding procedure all over. In this way a helix along the surface of revolution is formed constituting the first winding pattern 20. As is also seen in FIG. 5 a spacing 46 between the individual turns of the first winding pattern 20 is constant throughout the winding pattern 20. With regard to the counter winding pattern 22, FIG. 5 shows, that in this embodiment of the invention, the counter winding patter 22 is arranged within the first winding pattern 20 and located at half height of the longer side of the rectangle.

As is also visible in FIG. 5, in this embodiment of the magnetic resonance coil array 30, the magnetic resonance coil array 30 further comprises a DC cable 36. The DC cable 36 is configured to carry a DC signal and comprises a DC choke 38. The DC choke 38, in this case an inductor, is placed inside the toroidal form of the choke housing 12 of the self-compensated RF choke 10.

Figure 6:
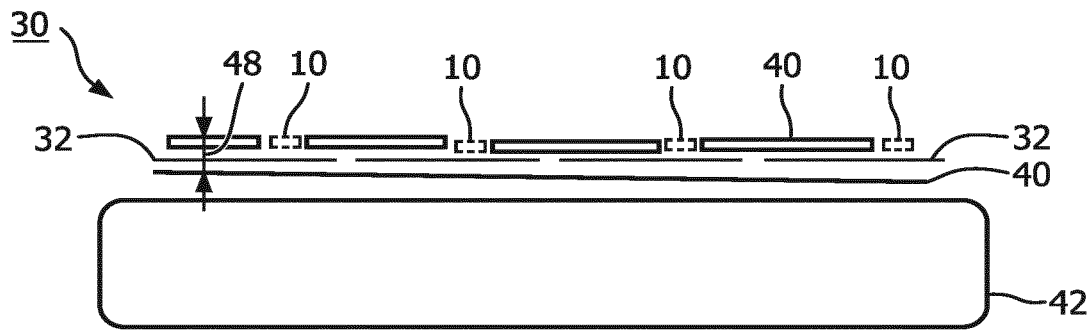
FIG. 6 schematically depicts a cross section through the magnetic resonance coil array according to another possible embodiment of the invention.

FIG. 6 schematically depicts a cross section through the magnetic resonance coil array 30 according to another possible embodiment of the invention. As can be seen in FIG. 6, the magnetic resonance coil array 30 comes close to an imaging subject 42 for performing magnetic resonance imaging. As is also depicted in FIG. 2, a possible embodiment of the magnetic resonance coil array 30 comprises the support structure 40. In the embodiment shown in FIG. 6, the support structure 40 is made of a flexible foam and has a bi-layered structure. The RF receive coils 32 of the magnetic resonance coil array 30 are arranged in between the two layers of foam. The self-compensated RF chokes 10 are arranged in the layer of foam that is farther away from the imaging subject. In this embodiment the RF receive coils 32, as well as the self-compensated RF chokes 10 and the coaxial cables 14 (not shown) are attached to the foam of the support structure 40 by sewing. The self-compensated RF chokes 10 are sewed to the support structure 40 in a loos manner that allows rotation and angulation of the self-compensated RF chokes 10 with regard to the support structure 40 for +/−30 degrees. In this embodiment a thickness 48 of the magnetic resonance coil array 30 is 12 mm.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

| | |
|---|---|
| receive coil array (Prior Art) | 1 |
| receive coil (Prior Art) | 2 |
| resonant RF traps (Prior Art) | 3 |
| coaxial cable (Prior Art) | 4 |
| fishbone structure (Prior Art) | 5 |
| input-output unit (Prior Art) | 6 |
| self-compensated radiofrequency choke | 10 |
| choke housing | 12 |
| coaxial cable | 14 |
| first end | 16 |
| second end | 18 |
| first winding pattern | 20 |
| counter winding pattern | 22 |
| axis of revolution | 24 |
| first cut out structure | 26 |
| second cut out structure | 28 |
| magnetic resonance coil array | 30 |
| receive coil | 32 |
| input-output unit | 34 |
| direct current cable | 36 |
| direct current choke | 38 |
| support structure | 40 |
| imaging subject | 42 |
| small hole | 44 |
| spacing | 46 |
| thickness | 48 |

The invention claimed is:

1. A radiofrequency choke for a magnetic resonance system comprising:
a choke housing having a toroidal form; and
a coaxial cable, wherein the coaxial cable has a first end and a second end and is configured to carry a magnetic resonance radiofrequency signal of the magnetic resonance system having a $B_1$-excitation field,
wherein a portion of the coaxial cable in between the first end and the second end is wound around the choke housing in a self-compensated winding pattern such that the radiofrequency choke compensates the $B_1$-excitation field, wherein the self-compensated winding pattern comprises a first winding pattern with windings around a surface of revolution of the toroidal form, and a counter winding pattern with at least one winding around an axis of revolution and along an outer circumference of the toroidal form.

2. The radiofrequency choke according to claim 1, wherein the choke housing comprises a first cut out structure and a second cut out structure, wherein the first cut out structure comprises multiple cut outs for guiding the first winding pattern of the self-compensated winding pattern, wherein each cut out is located in a plane comprising an axis of revolution of the toroidal form, wherein the second cut out structure comprises a further cut out for guiding the counter winding pattern of the self-compensated winding pattern, wherein the further cut out is located in a plane perpendicular to the axis of revolution of the toroidal form and along an outer circumference of the toroidal form.

3. The radiofrequency choke according to claim 1, wherein the choke housing comprises an open cut and/or a circular hollow opening.

4. The radiofrequency choke according to claim 1, wherein the coaxial cable is a micro coaxial cable and/or the toroidal form has a diameter of 12 mm+/−25% and a thickness of 5 mm+/−25%.

5. A magnetic resonance coil array for a magnetic resonance system having a $B_1$-excitation field, comprising multiple magnetic resonance receive coils, wherein the magnetic resonance receive coil is configured to output a magnetic resonance radiofrequency signal, an input-output unit, wherein the input-output unit is configured to receive the magnetic resonance radiofrequency signal, and multiple coaxial cables interconnecting the magnetic resonance receive coils with the input-output unit (34), wherein the coaxial cable are configured to carry the magnetic resonance radiofrequency signal and comprises a radiofrequency choke according to claim 1.

6. The magnetic resonance coil array according to claim 5, wherein the radiofrequency choke is a micro radiofrequency chokes and the coaxial cables are micro coaxial cable.

7. The magnetic resonance coil array according to claim 5, wherein at least one of the coaxial cables or the radiofrequency choke are high-impedance.

8. The magnetic resonance coil array according to claim 5, comprising a direct current cable configured to carry a direct current signal, wherein the direct current cable comprises a direct current choke, and wherein the direct current choke is placed inside the toroidal form of the choke housing of the radiofrequency chokes.

9. The magnetic resonance coil array according to claim 5, comprising a flexible support structure, wherein the multiple magnetic resonance receive coils are arranged as two-dimensional array on and/or in the support structure, and wherein the radiofrequency chokes and/or coaxial cables are arranged homogenously in that the weight of the self-compensated RF chokes and/or coaxial.

10. The magnetic resonance coil array according to claim 9, wherein the multiple magnetic resonance receive coils, the radiofrequency chokes, and/or the coaxial cables are fixed to the support structure by sewing, gluing, clamps and/or an additive printing process.

11. The magnetic resonance coil array according to claim 9, wherein the radiofrequency chokes are fixed to the support structure such that the radiofrequency chokes are rotatable and/or inclinable with respect to the support structure.

12. The magnetic resonance coil array of claim 9, wherein at least one of the DC cables or DC chokes is uniformly distributed across the flexible support structure on and/or in the support structure.

* * * * *